United States Patent
Fiorentino et al.

(10) Patent No.: US 8,737,845 B2
(45) Date of Patent: May 27, 2014

(54) OPTICAL ENGINE FOR POINT-TO-POINT COMMUNICATIONS

(75) Inventors: Marco Fiorentino, Mountain View, CA (US); Qianfan Xu, Mountain View, CA (US); Sagi Varghese Mathai, Berkeley, CA (US); Raymond G. Beausoleil, Redmond, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 322 days.

(21) Appl. No.: 12/991,109

(22) PCT Filed: May 7, 2008

(86) PCT No.: PCT/US2008/062958
§ 371 (c)(1),
(2), (4) Date: Feb. 14, 2011

(87) PCT Pub. No.: WO2009/136925
PCT Pub. Date: Nov. 12, 2009

(65) Prior Publication Data
US 2011/0129231 A1    Jun. 2, 2011

(51) Int. Cl.
| | | |
|---|---|---|
| *H04B 10/00* | (2013.01) | |
| *H04B 10/12* | (2011.01) | |
| *H04B 10/04* | (2011.01) | |
| *G02B 6/34* | (2006.01) | |
| *G02B 6/26* | (2006.01) | |
| *G02B 6/42* | (2006.01) | |

(52) U.S. Cl.
USPC ........... 398/200; 398/138; 398/139; 398/143; 398/182; 385/37; 385/39; 385/43; 385/51

(58) Field of Classification Search
USPC .......... 392/141–172; 398/141–172, 115–117, 398/135, 139; 385/37, 47, 48, 88
See application file for complete search history.

(56) References Cited

U.S. PATENT DOCUMENTS

| | | |
|---|---|---|
| 4,300,816 A | 11/1981 | Snitzer et al. |
| 4,828,349 A | 5/1989 | Nakasuji |

(Continued)

FOREIGN PATENT DOCUMENTS

| | | |
|---|---|---|
| JP | 04-015605 | 1/1992 |
| JP | 10-227928 | 8/1998 |

(Continued)

OTHER PUBLICATIONS

"Efficient coupling of a semiconductor laser to an optical fiber by means of a tapered waveguide on silicon." Shani et al, Dec. 4, 1989, Applied Physics Letters 55.*

(Continued)

*Primary Examiner* — David Payne
*Assistant Examiner* — Casey Kretzer (57) ABSTRACT

An optical engine for providing a point-to-point optical communications link between a first computing device and a second computing device. The optical engine includes a modulated hybrid micro-ring laser formed on a substrate and configured to generate an optical signal traveling parallel to the plane of the substrate. The optical engine further includes a waveguide, also formed in a plane parallel to the plane of the substrate, that is configured to guide the optical signal from the modulated ring laser to a defined region, a waveguide coupler at the defined region configured for coupling the optical signal into a multi-core optical fiber, and a multi-core optical fiber at the defined region that is configured to receive and transport the optical signal to the second computing device.

18 Claims, 7 Drawing Sheets

(56) References Cited

U.S. PATENT DOCUMENTS

| | | | |
|---|---|---|---|
| 5,448,661 A * | 9/1995 | Takai et al. | 385/24 |
| 5,535,294 A | 7/1996 | Kamuz et al. | |
| 5,657,407 A * | 8/1997 | Li et al. | 385/37 |
| 6,301,420 B1 | 10/2001 | Greenaway et al. | |
| 6,341,189 B1 | 1/2002 | Deacon et al. | |
| 6,792,025 B1 * | 9/2004 | Behfar et al. | 372/94 |
| 7,065,272 B2 | 6/2006 | Taillaert et al. | |
| 7,209,621 B2 | 4/2007 | Glebov et al. | |
| 7,336,684 B2 | 2/2008 | Sparacin et al. | |
| 7,729,579 B1 * | 6/2010 | Greiner et al. | 385/37 |
| 2002/0164137 A1 * | 11/2002 | Johnson et al. | 385/125 |
| 2003/0235370 A1 | 12/2003 | Taillaert | |
| 2004/0175082 A1 | 9/2004 | Birks et al. | |
| 2004/0208439 A1 * | 10/2004 | Bell et al. | 385/32 |
| 2005/0078702 A1 * | 4/2005 | Heuer et al. | 370/466 |
| 2006/0045418 A1 | 3/2006 | Cho et al. | |
| 2008/0292311 A1 * | 11/2008 | Daghighian et al. | 398/9 |

FOREIGN PATENT DOCUMENTS

| | | |
|---|---|---|
| JP | 2001-242348 | 9/2001 |
| JP | 2002-033550 | 1/2002 |
| JP | 2003-232944 | 8/2003 |
| JP | 2003-294964 | 10/2003 |
| JP | 2004-233606 | 8/2004 |
| JP | 2005-173043 | 6/2005 |
| JP | 2005-234319 | 9/2005 |
| JP | 2007-212786 | 8/2007 |
| JP | 2009-537871 | 10/2009 |
| WO | WO-2008/005721 | 1/2008 |

OTHER PUBLICATIONS

Shani et al, "Efficient coupling of a semiconductor laser to an optical fiber by means of a tapered waveguide on silicon" (published in Applied Physics Letters 55 Dec. 4, 1989).*

PCT Search Report for PCT/US2008/062958, Report dated Dec. 30, 2008.

Chang, Hsu-Hao, 1310nm silicon evanescent laser, Sep. 3, 2007, vol. 15, No. 18/Optics Express 11466.

Choi, Seung June, Microdisk Lasers Vertically Coupled to Output Waveguides, IEEE Photonics Technology Letters, vol. 15, No. 10, Oct. 2006.

Fang, Alexander W., Electrically pumped hybrid AlGaInAs-silicon evanescent laser, Oct. 2, 2006, vol. 14, No. 20/Optics Express 9203.

Fang, Alexander W., Integrated AlGaInAs-silicon evanescent racetrack laser and photodetector, Mar. 5, 2007, vol. 15, No. 5/Optics Express 2315.

Fujita, M., Continuous wave lasing in GaInAsP microdisk injection laser with threshold current of 40uA, Apr. 27, 2000, Electronics Letters vol. 36 No. 9.

Hattori, H.T., Heterogeneous Integration of Microdisk Lasers on Silicon Strip Waveguids for Optical Interconnects, IEEE Photonics Technology Letters, vol. 18, No. 1, Jan. 1, 2006.

Koch, Brian R., Mode-locked silicon evanescent lasers, Sep. 3, 2007, vol. 15, No. 18, Optics Express, pp. 11225-11233.

Park, Hyndai, Hybrid silicon evanescent laser fabricated with a silicon waveguide and III-V offset quantum wells, Nov. 14, 2005, vol. 13, No. 23/Optics Express 9460.

Park, Hyundai, A Hybrid AlGaInAs-Silicon Evanescent Amplifier, IEEE Photonics Technology Letters, vol. 19, No. 4, Feb. 15, 2007.

Romeo, P. Fojo, InP on Silicon Electrically Driven Microdisk Lasers for Photonic IC's, Laboratorie d'Electronique, Ecole Centrale de Lyon, Jan. 2006.

Seassal, C., InP microcisk lasers on silicon wafer: CW room temperature operation at 1.6um, Feb. 15, 2001, Electronics Letters vol. 37 No. 4.

Sysak, Matthew N., Experimental and theoretical thermal analysis of a Hybrid Silicon Evanescent Laser, Nov. 12, 2007, vol. 15, No. 23/Optics Express 15041.

Taillaert, Dirk, "A Compact Two-Dimensional Grating Coupler Used as a Polarization Splitter", IEEE Phontonics Technology Letters, vol. 15, No. 9, Sep. 2003, pp. 1249-1251.

Taillaert, Dirk, "An Out-of-Plane Grating Coupler for Efficient Butt-Coupling Between Compact Planar Waveguides and Single-Mode Fibers", IEEE Journal of Quantum Electronics vol. 38, No. 7, Jul. 2002, pp. 949.

Taylor, D.M., Demonstration of multi-core photonic crystal fibre in an optical interconnect, Electronics Letters, Mar. 16, 2006, vol. 42, No. 6.

Van Campenhout, J., Electrically Injected InGaAsP Microdisk Lasers Heterogeneously Integrated on a Si-wafer, Ghent University-IMEC, Department of Information Technology, Mar. 2006.

* cited by examiner

OPTICAL ENGINE FOR POINT-TO-POINT COMMUNICATIONS

BACKGROUND OF THE INVENTION

Computer performance is increasingly restricted by the ability of computer processors to quickly and efficiently access off-chip memory or communicate with other peripheral devices. The restriction is due, in part, to inherent physical limitations in the number of electrical pins that can fit into a connector of a defined size and surface area, which in turn determines the maximum electrical bandwidth. Saturation in the density of electrical pins results in "pin-out bottleneck" for a processor or chip, which describes the situation when the electrical bandwidth of a chip package becomes a performance limiting factor.

DETAILED DESCRIPTION OF EXEMPLARY EMBODIMENTS

The following detailed description of exemplary embodiments of the invention makes reference to the accompanying drawings, which form a part thereof and in which are shown exemplary embodiments in which the invention may be practiced. While these exemplary embodiments are described, by way of illustration, in sufficient detail to enable those skilled in the art to practice the invention, it should be understood that other embodiments may be realized and that various changes to the invention may be made without departing from the spirit and scope of the present invention. As such, the following more detailed description of the embodiments of the present invention is not intended to limit the scope of the invention as it is claimed, but is presented for purposes of illustration only; to describe the features and characteristics of the present invention, and to sufficiently enable one skilled in the art to practice the invention. Accordingly, the scope of the present invention is to be defined solely by the appended claims.

The following detailed description and exemplary embodiments of the invention will be best understood by reference to the accompanying drawings, wherein the elements and features of the invention are designated by numerals throughout.

Illustrated in FIGS. 1-12 are various exemplary embodiments of the present invention for an optical engine for a point-to-point communication link between two computing devices, such as two computer chips. The optical engine can be used to overcome the increasing bottlenecks in computer performance resulting from the inability to quickly access off-chip memory or communicate with other peripheral devices. The restriction is due, in part, to inherent physical limitations in the number of electrical pins that can fit into a connector of a defined size and surface area, which in turn determines the maximum bandwidth for communication. Thus, one exemplary application for the present invention can be to establish intra-chip or point-to-point optical communications between a microprocessor and a separate memory chip or device.

The optical engine is a combination of components which provides greatly improved performance at a reduced manufacturing cost. As will be described in more detail hereinafter, the optical engine can include one or more hybrid, evanescent micro-ring lasers which generate optical signals in resonators and waveguides formed in a plane parallel to a plane of the optical engine chip or substrate. The waveguides can be used to carry the optical signals to a defined location or region (e.g. in the center of the chip or at the chip-edge) for coupling into multi-core optical fibers for transport to a second computing device. If the defined region is toward the center of the chip, the optical signals can be bent out-of-plane to the plane of the substrate with grating coupling pads and coupled into the optical cores of a multi-core optical fiber orientated out-of-plane to the plane of the substrate. Where the defined region is at the edge of the chip, the optical signals can be concentrated with waveguide tapers and coupled into the cores of a multi-core optical fiber ribbon aligned with the waveguides and orientated parallel to the plane of the substrate.

Photonic detectors can be included to receive optical signals broadcast from the second computing device. As a photonic optical signal detector, or photo-detector, is generally less complex than an optical signal generator (i.e. laser, LED, etc.) the photo-detectors can be located at the defined region to directly receive the input signals traveling through the multi-core optical fiber, or like the micro-ring lasers, they can be distributed over the surface of the chip and similarly coupled to the multi-core optical fiber with grating coupling pads or tapered waveguides.

The optical engine of the present invention can help resolve the "pinout bottleneck" facing computer designers today, resulting from the approximate upper limit of a few thousand electrical pins per chip. Some of these electrical pins are used for CPU-to-memory traffic or other secondary communications which may lend themselves to point-to-point links. By providing direct optical connections between two computing devices and off-loading the CPU-to-memory or secondary communications into separate multi-channel, point-to-point optical links, a significant number of input/output pins can be reassigned to other uses within the electrical bus, resulting in a substantial increase in bandwidth available for other internal computer operations.

The present invention provides further advantages over the prior art, which can include both traditional wired connectors and more recent developments in optical fiber communications technology. One benefit is lower manufacturing costs, since each component of the optical engine, including the micro-ring lasers, photo-detectors, waveguides, and optical couplers, can be manufactured using cost-effective, high-volume fabrication processes, such as VLSI (Very Large Scale Integration) fabrication techniques. Another advantage is the greatly increased bandwidth provided by the use of micro-ring lasers that can be directly modulated at frequencies up to 1 GHz and greater by the attached computing device. A related improvement is the relatively low power consumption of the micro-ring lasers, as compared to prior light-emitting systems using vertical cavity surface-emitting lasers (VCSELs) and light-emitting diodes (LEDs), One distinct advantage of the present invention over the prior art is the capability for distributing the micro-ring lasers and/or photo-detectors over the surface of the optical engine chip, and guiding the optical signals via waveguides to and from a defined region where a large number of optical signals can be concentrated and organized into a small footprint configurable for coupling into a single multi-core optical fiber, such as a photonic crystal fiber or an optical fiber ribbon. This capability is not available with VCSELs, in which the orientation and relatively large size of the VCSELs sharply limits the number of optical signals that can fit into the footprint of a multi-core optical fiber. Furthermore, as VCSELs cannot be directly integrated into silicon, optical engines based on VCSEL technology cannot be directly combined with silicon-based photo-detectors. With prior optical systems, therefore, a separate chip with detectors may be required to receive an incoming signal and complete the duplex communications link. In contrast, each component of the present invention can be fabricated using III-V group semiconductor materials, allowing for the transmitting micro-ring lasers, the receiving photo-detectors and their associated components to be integrated into the same chip.

The present invention offers additional benefits that can be attractive to computer designers and engineers. For instance, all the point-to-point traffic between the two computing devices can be handled by a multi-core optical fiber, such as a photonic crystal fiber or optical fiber ribbon, which can be actively or passively aligned to the optical couplers, and which can be attached to the defined region on the optical engine using proven adhesive materials and methods. Moreover, the present invention provides the convenience and flexibility of directly integrating the optical engine into the computing device, or fabricating the engine on a separate chip for subsequent wafer-mounting to the computing device.

Each of the above-recited advantages and improvements will be apparent in light of the detailed description set forth below, with reference to the accompanying drawings. These advantages are not meant to be limiting in any way. Indeed, one skilled in the art will appreciate that other benefits and advantages may be realized, other than those specifically recited herein, upon practicing the present invention.

Figure 1:
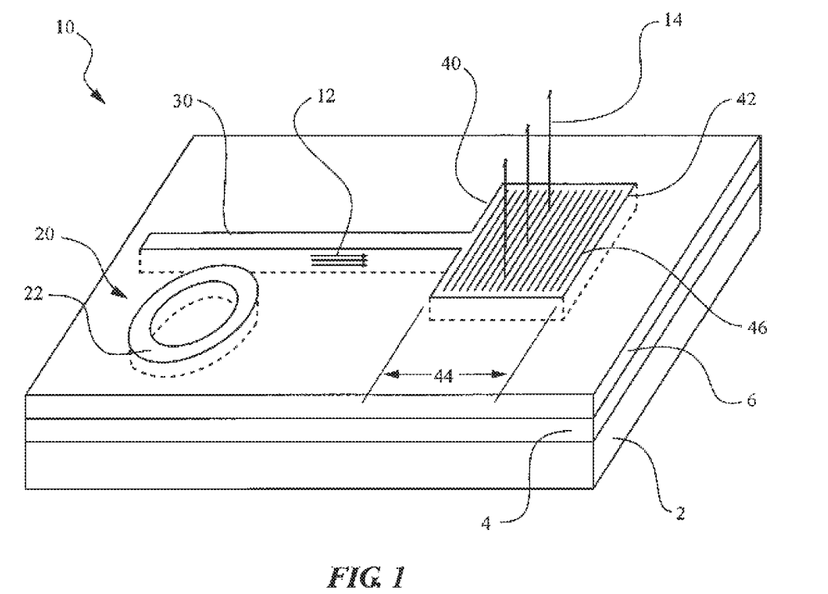
FIG. 1 is an illustration of a transmitting base unit, according to an exemplary embodiment of the present invention.

Illustrated in FIG. 1 is a transmitting base unit 10, according to an exemplary embodiment of the present invention, which can be used to generate an optical signal modulated by a first computing device (not shown), and to couple the optical signal into a multi-core optical fiber for transport to a second computing device. The transmitting base unit can include a micro-ring laser 20, an optical waveguide 30 and an out-of-plane optical coupler 40, which together can function to generate, transport and couple a single modulated optical signal or light beam 12 (e.g. infrared beam) from the first computing device to the second computing device. A plurality of transmitting base units 10 can be distributed over the surface of the optical engine to produce a multi-channel optical pathway having a large bandwidth and to allow for fast, high-volume communication between the two computing devices.

Each of the components in the transmitting base unit can be fabricated using known high-volume (for example, VLSI) fabrication techniques on one or more underlying base layer(s) 4 formed on top of a silicon-based chip substrate 2. Although the transmitting base unit components are represented in FIG. 1 as being formed in a single optical engine layer 6 overlying the base layer(s) 4 and substrate 2, it can be appreciated by one with skill in the art that the various base unit components, particularly the micro-ring laser 20, can be built up of various sub-layers formed from differing materials. For example, the hybrid micro-ring laser can be fabricated from seven or more differing layers used to create the under-cladding, the micro-ring resonator and waveguide, InP charge injection layers, electrodes, etc.

It can be further appreciated that the components of the transmitting base unit can be embedded within the optical engine layer 6 as illustrated, or can be formed to extend above the top of the layer and be surrounded by empty space or a transparent protective coating. Electrical connections between the optical engine and its driving computing device can be provided for in the underlying base layer(s) 4.

The micro-ring laser 20 that generates the optical beam 12 can be a low-power, electrically-pumped hybrid III-V-silicon laser that is directly modulated at speeds up to 1 GHz or greater by the attached computing device. Direct modulation eliminates the need for electro-opto modulators found in earlier optical systems. With a ring resonator 22 diameter as small as 5 μm, the micro-ring laser can be several orders of magnitude smaller than existing evanescent resonating racetrack lasers. This compact size and reduction in auxiliary elements allows for a large number of lasers to be integrated onto a single chip occupying less space than prior art methods, while simultaneously providing for improved placement and organization.

Another aspect of the present invention's flexibility is the hybrid micro-ring laser's configurability for both single and multi-mode operation. In an exemplary embodiment, for instance, the optical engine of the present invention can be configured for single-mode operation centered around the 1310 nm or 1550 nm wavelengths.

The operation and functionality of the micro-ring laser 20, including its configurability for both single and multi-mode operation, is more specifically set forth in commonly owned and co-pending PCT Patent Application No. PCT/US081/62791, filed May 6, 2008, and entitled "System and Method For Micro-ring Laser," which is incorporated by reference in its entirety herein.

In the embodiment illustrated in FIG. 1, the modulated micro-ring laser 20 emits a modulated optical beam or output optical signal 12 into a silicon optical waveguide 30. The waveguide 30 begins as an integral part of the hybrid micro-ring laser and carries the optical signal 12 to an out-of-plane or transmitting optical waveguide coupler 40. As multiple transmitting base units 10 can be formed on a single chip, the distance between the micro-ring laser and the waveguide coupler is relatively short, on the order of 100 μm or less, which serves to minimize the loss or attenuation of the optical signal as it travels through the solid silicon waveguide. In an exemplary embodiment, the waveguide 30 can have a square or rectangular cross section with dimensions of about 0.5 µm×0.5 µm.

The out-of-plane transmitting optical coupler 40 is used to bend the output optical signal out-of-plane to the plane of the underlying substrate 2. Differing types of optical coupling devices, such as silvered mirrors, beamsplitters, optical grating pads, etc., can be used to bend the optical beam out-of-plane. In an exemplary embodiment, the optical signal can be bent substantially perpendicular, or 90 degrees, to the plane of the substrate, but it is to be appreciated that re-directing the optical beam at angles of about 30 degrees or more for coupling into a multi-core optical fiber can also be considered to fall within the scope of the present invention.

One low-cost but highly effective device for coupling the output optical signal 12 out-of-plane to the plane of the substrate can be a grating pad coupler 42. The grating pad coupler can generally comprise an expanded section or pad 44 of the optical waveguide 30 that can be made from the same or differing material and which can be formed integrally with or separate from the waveguide. The pad 44 can have a width much greater than its thickness. A grating pattern of slots 46 can be etched or otherwise formed in the top surface of the coupling grating pad and extend downward into the body of the grating coupler. The grating coupler can operate on the principle of light diffraction, wherein an optical signal contacting a slot as it travels through the pad material will be split into several components, including a transmitted component, a reflected component, and an out-of-plane component. By using multiple slots which are precisely dimensioned and spaced along the top surface of the grating pad, a substantial portion of the optical beam can be re-directed into a transmitted optical signal 14 traveling out-of-plane to the plane of the waveguide.

The efficiency of the grating coupler in bending the optical signal 12 out-of-plane to the plane of the substrate 2 can be optimized through control of the dimensions and spacing of the grating slots relative to the wavelength of the optical beam. Thus, the grating coupler can be tuned or optimized for the center wavelength of laser light emitted by the micro-ring laser, as can the waveguide which connects the two devices together. Tuning the entire transmitting base unit to the wavelength of light generated by the micro-ring laser, such as to the 1310 nm or 1550 nm wavelengths described above, can simultaneously maximize the output of the base unit while minimizing the loss of the optical signal moving through each component, resulting in an optical engine with reduced power requirements.

Figure 2:
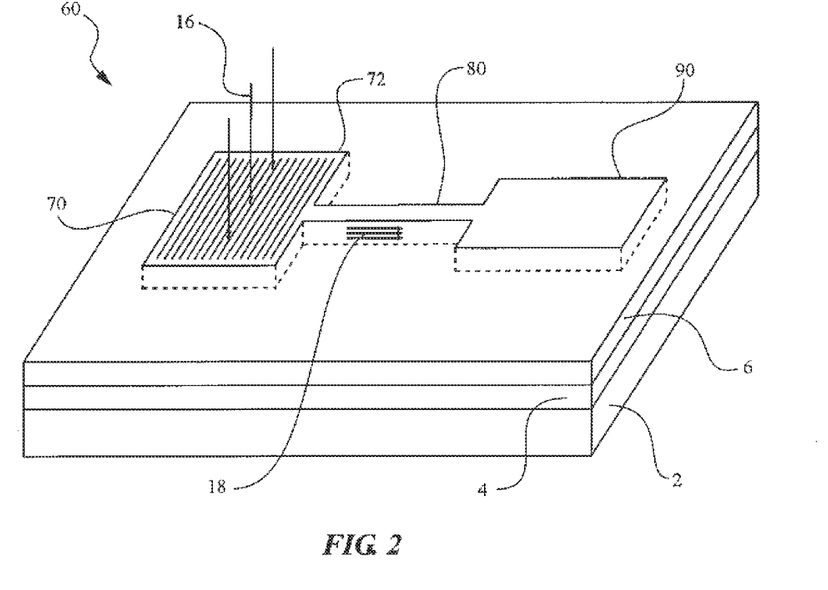
FIG. 2 is an illustration of a receiving base unit, according to an exemplary embodiment of the present invention.

Illustrated in FIG. 2 is a receiving base unit 60, according to an exemplary embodiment of the present invention. The receiving base unit is organized similar to the transmitting base unit, with a receiving out-of-plane optical coupler 70 and waveguide 80 leading to an optical device. But in the case of the receiving unit, however, the received optical signal 18 travels in the opposite direction (i.e. from the out-of-plane optical coupler to the optical device), and the optical device is a photonic optical signal detector, or photo-detector 90, rather than a micro-ring laser.

The receiving optical coupler 70 can be used to bend an incoming optical beam or input optical signal 16 traveling out-of-plane to the plane of the substrate 2 into a received optical signal 18 moving through the waveguide 80 and parallel to the plane of the substrate 2. The receiving optical coupler 70 can be substantially identical to the transmitting optical coupler, and can further comprise the various types of optical coupling devices, including a silvered mirrors, beamsplitters, optical grating pads, etc.

In the exemplary embodiment illustrated in FIG. 2 the receiving optical coupler 70 can be a grating pad coupler 72 that is substantially identical to the grating pad coupler used in the transmitting base unit. The reasons for this can be two-fold. One is because grating couplers can be equally efficient at bending light traveling in both directions. The other is, as will be described in more detail hereinafter, identical optical engines optimized to a specific wavelength of light can often be used in pairs, with the receiving portion of one engine tuned to receive and transport the optical beam generated by the transmitting portion of the other. Consequently, the grating coupler 72 on a receiving base unit 60 can be configured to receive an input optical signal 16 originally generated and transmitted from a transmitting base unit optimized to the same wavelength of light, in which case both grating couplers can be substantially identical.

Once the input optical signal 16 has been captured and coupled into the receiving base unit by the grating coupler 72, the received optical signal 18 can be transported along the waveguide 80 to the photo-detector 90. The photo-detector can include differing types of optical detecting devices, such as a layer of germanium or III-V material, a p-i-n or Schottky diode, a photo-transistor, etc. In an exemplary embodiment, however, the photo-detector can be made from the same III-V group semiconductor materials as the micro-ring laser to facilitate the fabrication of the optical engine. And in yet another exemplary embodiment, the photo-detector and the micro-ring laser can operate on essentially the same optical evanescent principles, the primary difference being that the photo-detectors are reversed biased as compared to the micro-ring lasers to collect, rather than generate, photons.

Figure 3:
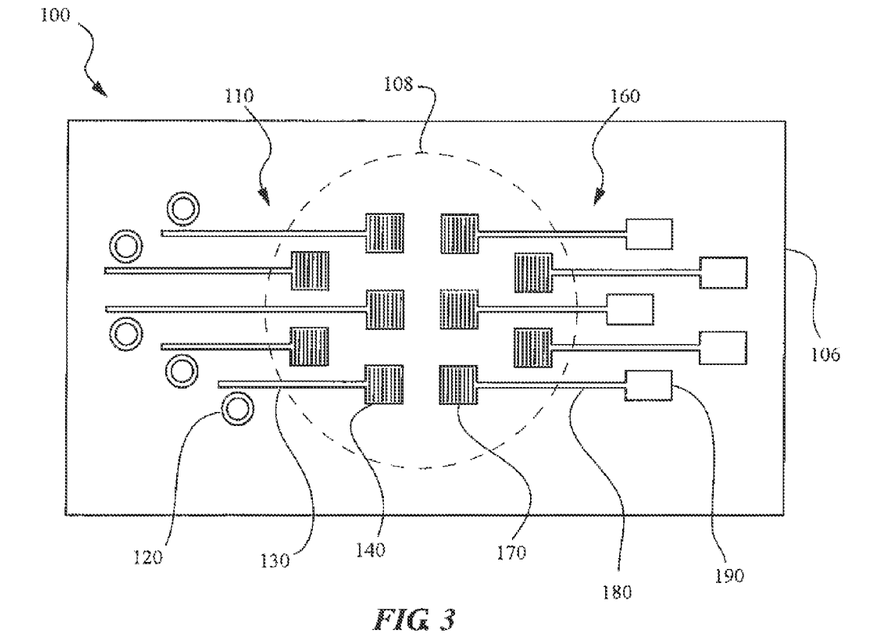
FIG. 3 is an illustration of an optical engine, according to an exemplary embodiment of the present invention.

Illustrated in FIG. 3 is an exemplary embodiment 100 of the optical engine, which combines a plurality of both transmitting 110 and receiving 160 base units on a single chip 106 to allow for full duplex operation between optical devices. As shown in FIG. 3, a plurality of five transmitting base units 110, each further comprising a separate micro-ring laser 120, a waveguide 130 and a transmitting grating coupler 140, can be organized on the chip so that the micro-ring lasers are distributed toward the periphery and the grating couplers are concentrated within a central location or defined region 108. Likewise, a plurality of five receiving base units 160, each further comprising a receiving grating coupler 170, a waveguide 180 and a photo-detector 190, can be similarly organized on the chip so that the photo-detectors are distributed toward the periphery and the receiving grating couplers 170 are congregated within the same centralized defined region 108, adjacent the transmitting grating couplers 140.

FIG. 3 illustrates the advantages provided by transmitting 110 and receiving 160 base units that operate a plane parallel to the plane of the chip or substrate 106. This "horizontal" orientation removes the prior art limitation of placing the lasers themselves at the defined region 108, and allows for a large number of micro-ring lasers 120 and photo-detectors 190 to be distributed over the surface of the optical engine substrate 106, while using relatively narrow waveguides 130, 180 to efficiently route or direct the optical signals to the grating couplers 140, 170 concentrated at the defined location. FIG. 3 illustrates an exemplary embodiment having ten grating couplers formed at the defined location, but it is to be appreciated that the small footprint of the grating couplers 140, 170 and the narrow width of the silicon waveguides 130, 180 can allow the defined region to be configured for at least thirty or more optical channels.

Figure 4:
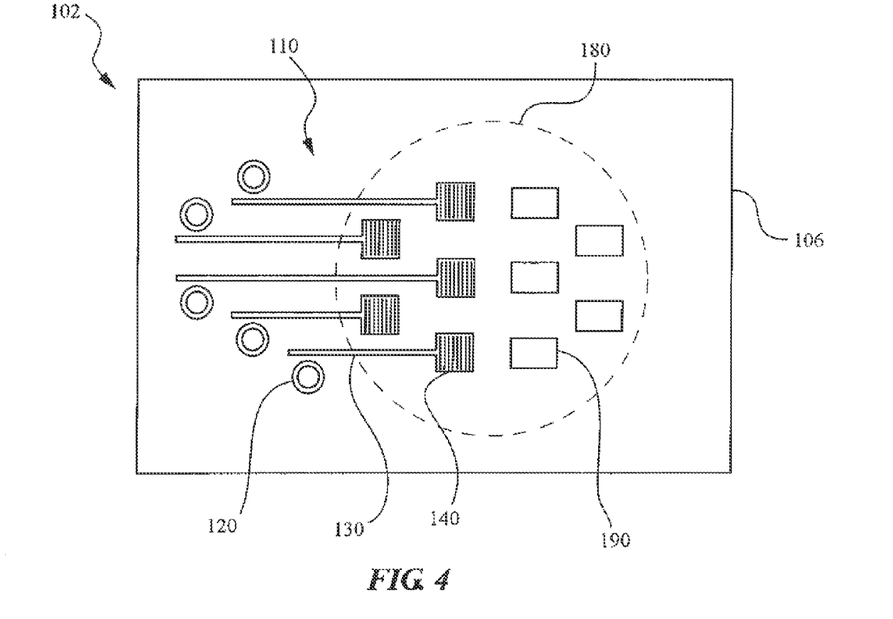
FIG. 4 is an illustration of an optical engine, according to another exemplary embodiment of the present invention.

Shown in FIG. 4 is an alternative embodiment 102 of the optical engine, in which the photo-detectors themselves can be located at the defined region to directly receive the input signals traveling through the multi-core optical fiber. As photo-detectors are generally less complex than optical signal generators (i.e. laser, LED, etc.), and can be configured to receive an optical signal either parallel to or out-of-plane to the plane of the substrate 106. The receiving base units in the previous embodiments can be replaced with just the photo-detectors 190 themselves, which can be located inside the defined region 108 in generally the same positions as the receiving grating couplers. This embodiment can simplify fabrication of the optical engine chip and reduce costs, and can allow for more of the surface area of the chip to be devoted to the placement of transmitting base units.

The positioning of the transmitting grating couplers 140 and the photo-detectors 190 within the central location or defined region 108 as shown in FIG. 4 is only representative, and is not limited to the side-by-side configuration shown. It is to be appreciated by one having skill in the art that the transmitting base units 110 and photo-detectors 190 can be repositioned and intermixed inside the defined region 108 and over the surface of the optical engine chip 106 in a variety configurations to optimize component distribution, lines-of-sight to the multi-core optical fiber, and electrical pathways formed in the underlying base layer(s).

Figure 5:
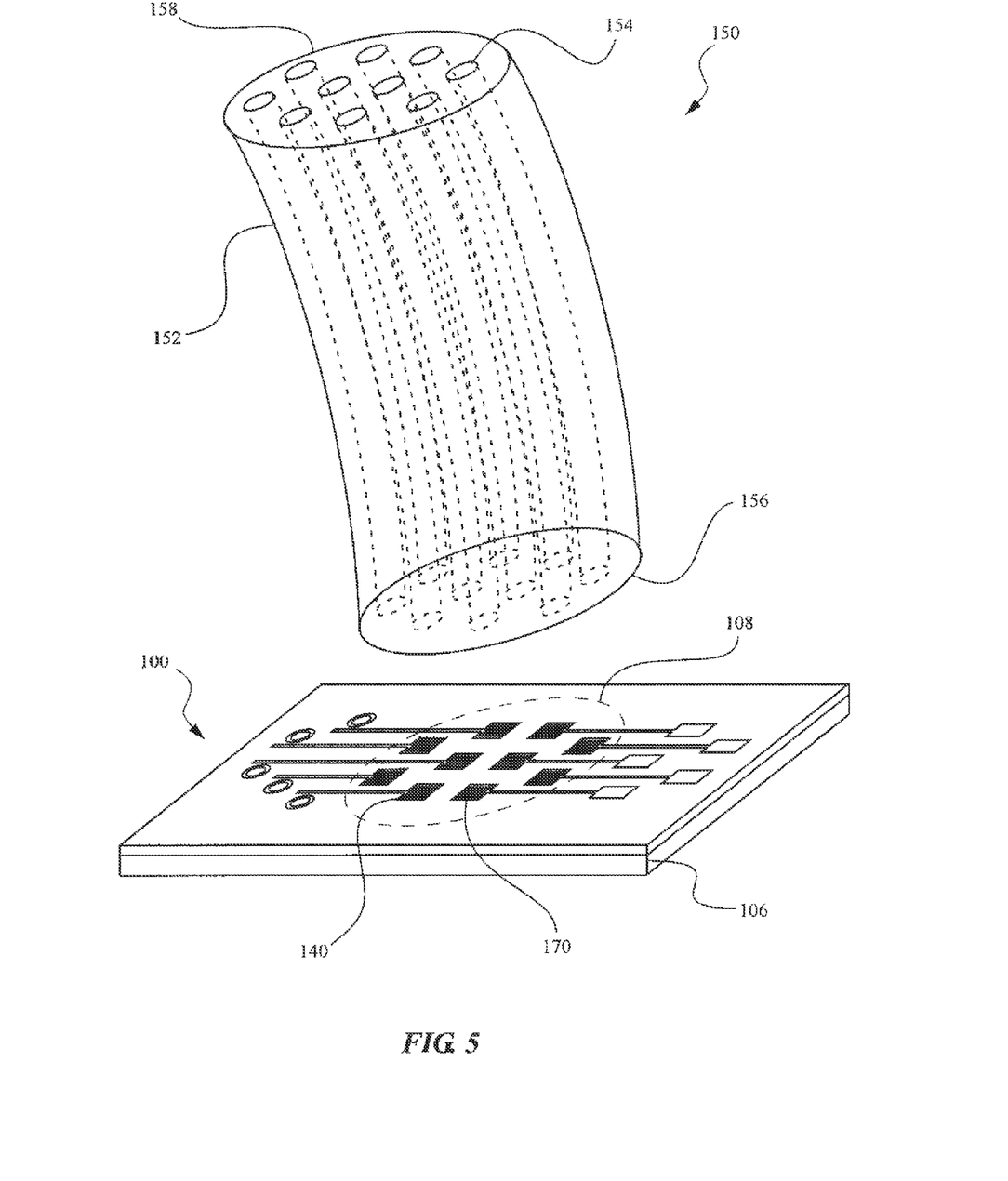
FIG. 5 is an illustration of an optical engine and a multi-core optical fiber, according to an exemplary embodiment of the present invention.

FIG. 5 is an illustration of an optical engine 100 and a single- or multi-mode, multi-core optical fiber 150, such as a photonic crystal fiber, according to an exemplary embodiment of the present invention. The multi-core optical fiber can comprise an outer layer or sheath 152 surrounding a plurality of optical cores 154 running through the length of the multi-core optical fiber. The cores can comprise a substantially transparent material formed from a solid, a gas, a liquid or a void, which allows the optical signal to propagate through the core. Moreover, the cores 154 can have a uniform cross-section and spacing apart from each other along the length of the fiber 150. It is to be further understood that the optical cores of the multi-core optical fiber can be compatible with the optical signals produced by the micro-ring lasers, and can thus be configurable for single- or multi-mode operation.

The multi-core optical fiber 150 can have a proximate end 156 for coupling to the central location or defined region 108 of the optical engine chip 106, and a distal end 158 for coupling to a defined region of an optical engine associated with a second computing device (not shown). The proximate end 156 can be coupled to the defined region 108 of the optical engine chip 106 so that the optical cores 154 align with the out-of-plane optical couplers 140, 170 located within the defined region. The proximate end 156 of the fiber 150 can also be attached to the top surface of the optical engine chip 106 with an appropriate adhesive, attachment method or attachment structure.

Alignment of the optical cores 154 with the out-of-plane optical couplers 140, 170 can be accomplished through passive, or self-alignment methods, as well as active methods that monitor the strength of one or more optical signals passing through the multi-core optical fiber 150, such as a photonic crystal fiber, as the fiber is coupled to the chip. More detail on the various aspects and methods for aligning and coupling the multi-core optical fiber to the optical engine is specifically set forth in commonly owned and co-pending U.S. Provisional Patent Application No. 61/020,372, filed Jan. 10, 2008, and entitled "Method for Connecting Multicore Fibers to Optical Devices," which is incorporated by reference in its entirety herein.

Figure 6A:
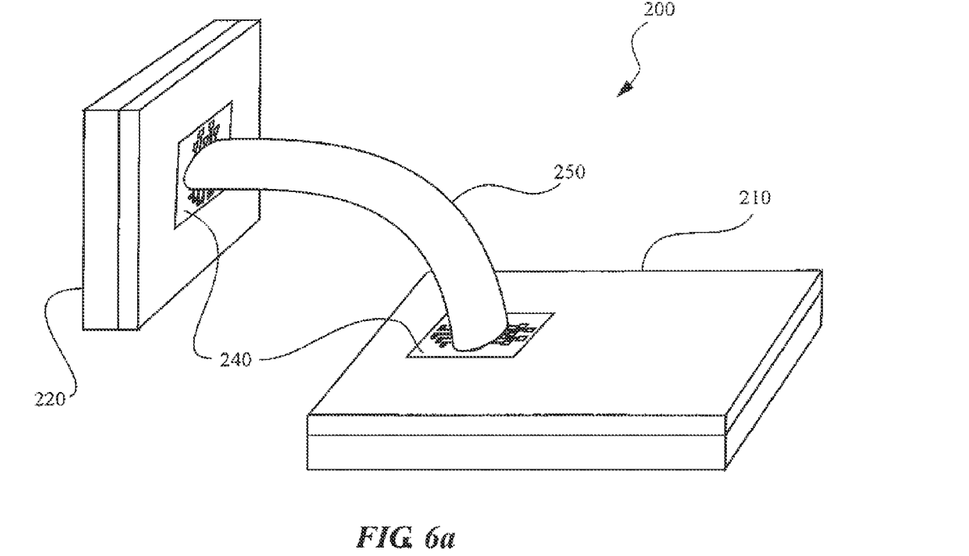
FIG. 6a is an illustration of a point-to-point optical communications link between optical engines formed on a first chip and a second chip, according to an exemplary embodiment of the present invention.

Illustrated in FIG. 6a is a point-to-point optical communications link 200 between optical engines directly integrated into a first and second computing device, such as a central processing unit 210 and a separate memory chip 220. In this exemplary embodiment, the optical engines 240 can be integrated directly into the circuitry of the computing devices 210, 220 during fabrication, and then connected with a multi-core optical fiber 250 that is coupled and aligned to the defined regions of both optical engines.

Figure 6B:
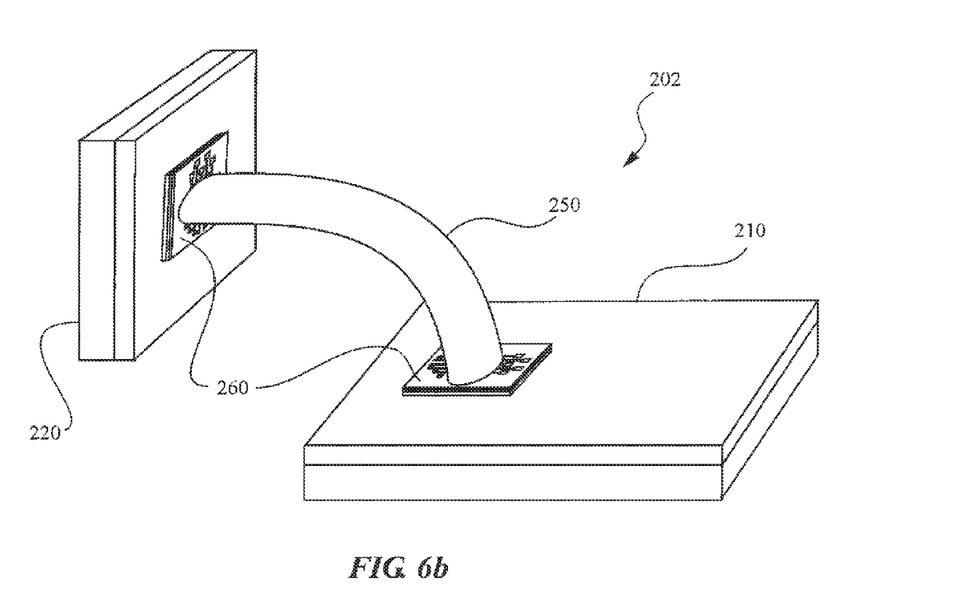
FIG. 6b is an illustration of a point-to-point optical communications link between optical engine chips bonded to first and second computing devices, according to an exemplary embodiment of the present invention.

FIG. 6b further illustrates another aspect of the present invention, in which separate optical engine chips 260 have been wafer mounted to the two adjacent computing devices 210, 220, and then linked with the multi-core optical fiber 250 to create the point-to-point optical communications link 202. Forming the optical engines on separate chips 260 which are later attached to the computing devices can provide for greater control over the manufacturing processes used in fabricating the chip and for economies of scale in reducing fabrication costs. Separate optical engine chips 260 can also allow for the creation of a communications protocol that is substantially independent of the computing device upon which the optical engine is mounted.

Figure 7:
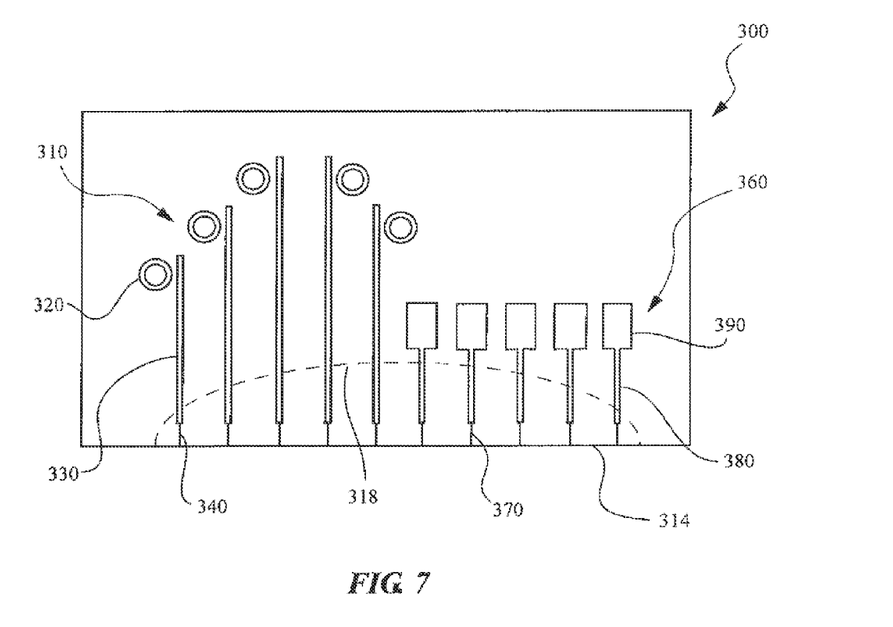
FIG. 7 is an illustration of an optical engine, according to another exemplary embodiment of the present invention.
Figure 8:
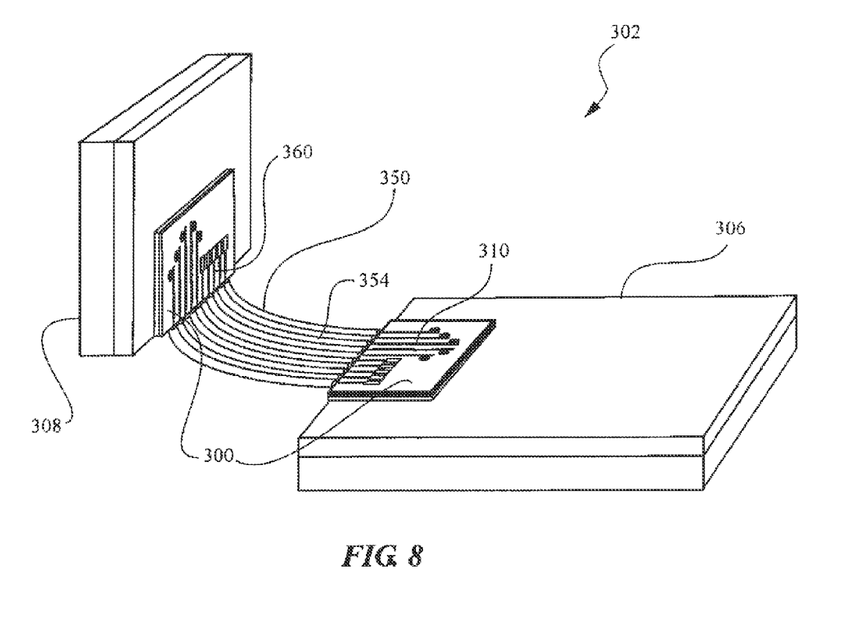
FIG. 8 is an illustration of a point-to-point optical communications link between optical engine chips bonded to a first and a second computing device, according to another exemplary embodiment of the present invention.

FIGS. 7 and 8 together illustrate another exemplary embodiment of a point-to-point optical link 302 created between optical engine chips 300 that can be wafer mounted to first 306 and second 308 computing devices. In this embodiment, both the transmitting base units 310 and the receiving base units 360 formed in the optical engine chip 300 can be orientated towards an edge 314 of the chip, instead of towards the center of the chip as described in previous embodiments. In the transmitting base units 310, an output optical signal can be generated in micro-ring lasers 320 and transported in output waveguides 330 towards a defined region 318 organized around the edge 314 of the chip or substrate, for coupling into an optical fiber ribbon 350 that can be aligned with the waveguides 330 and orientated parallel to the plane of the substrate. Prior to reaching the edge, however, the optical signal can be passed into waveguide tapers 340 which transform the mode of the optical signal into the fundamental mode of the individual optical fibers 354 forming the optical fiber ribbon.

The optical fiber ribbon 350 can carry the output signal to the receiving portion of a similar optical engine chip 300 mounted on another computing device 308 (see FIG. 8). And in a reciprocal duplex fashion, the micro-ring lasers on the second optical engine chip can send an input signal back through the optical fiber ribbon 350 to the optical engine chip mounted on the first computing device 306 for reception through waveguide tapers 370 (see FIG. 7) into input waveguides 380 that can carry the input optical signal to a receiving photo-detector 390.

Figure 9:
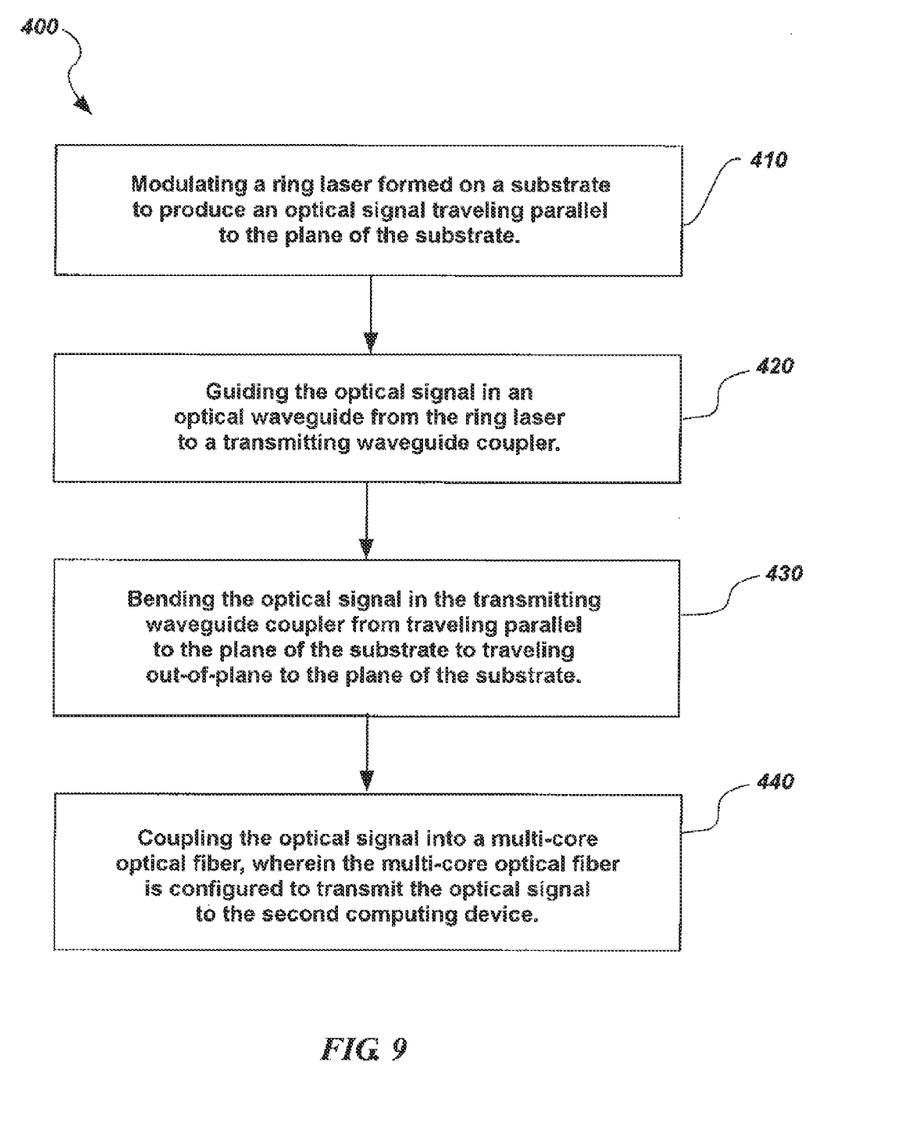
FIG. 9 is a flowchart describing a method for transmitting point-to-point communications between a first computing device and a second computing device, according to an exemplary embodiment of the present invention.

FIG. 9 is a flowchart describing a method 400 for transmitting point-to-point communications between a first computing device and a second computing device, according to an exemplary embodiment. The method includes the operations of modulating 410 a ring laser formed on a substrate of the first computing device to produce an optical signal traveling parallel to the plane of the substrate, and guiding 420 the optical signal in an optical waveguide, also formed in a plane parallel to the plane of the substrate, from the ring laser to a transmitting waveguide coupler. The method further includes the steps of bending 430 the optical signal in the transmitting waveguide coupler from traveling parallel to the plane of the substrate to traveling out-of-plane to the plane of the substrate, and coupling 440 the optical signal into a multi-core optical fiber, where the multi-core optical fiber is configured to transmit the optical signal to the second computing device.

Figure 10:
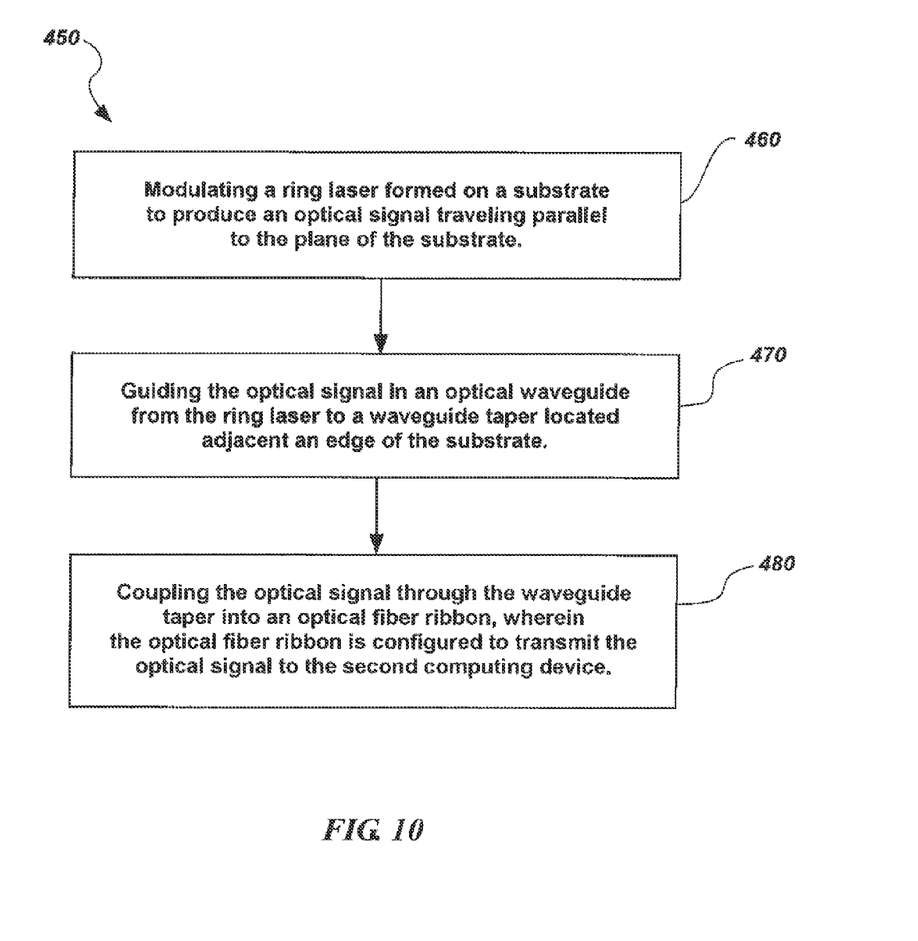
FIG. 10 is a flowchart describing a method for providing point-to-point communications between a first computing device and a second computing device, according to another exemplary embodiment of the present invention.

Depicted in FIG. 10 is a flowchart of yet another method 450 for providing point-to-point communications between a first computing device and a second computing device. The method includes the operations of modulating 460 a ring laser formed on a substrate of the first computing device to produce an optical signal traveling parallel to the plane of the substrate, guiding 470 the optical signal in an optical waveguide, also formed in a plane parallel to the plane of the substrate, from the ring laser to a waveguide taper located adjacent to an edge of the substrate, and coupling 480 the optical signal through the waveguide taper into an optical fiber ribbon, where the optical fiber ribbon is configured to transmit the optical signal to the second computing device.

The foregoing detailed description describes the invention with reference to specific exemplary embodiments. However, it will be appreciated that various modifications and changes can be made without departing from the scope of the present invention as set forth in the appended claims. The detailed description and accompanying drawings are to be regarded as merely illustrative, rather than as restrictive, and all such modifications or changes, if any, are intended to fall within the scope of the present invention as described and set forth herein.

More specifically, while illustrative exemplary embodiments of the invention have been described herein, the present invention is not limited to these embodiments, but includes any and all embodiments having modifications, omissions, combinations (e.g., of aspects across various embodiments), adaptations and/or alterations as would be appreciated by those in the art based on the foregoing detailed description. The limitations in the claims are to be interpreted broadly based on the language employed in the claims and not limited to examples described in the foregoing detailed description or during the prosecution of the application, which examples are to be construed as non-exclusive. For example, in the present disclosure, the term "preferably" is non-exclusive where it is intended to mean "preferably, but not limited to." Any steps recited in any method or process claims may be executed in any order and are not limited to the order presented in the claims.

What is claimed is:

1. An optical engine for providing point-to-point communications between a first computing device and a second computing device comprising, formed on a single chip:
    a modulated ring laser on a substrate and coupled to a first computing device the modulated ring laser being configured for generating an optical signal traveling parallel to the plane of the substrate;
    a waveguide formed in a plane parallel to the plane of the substrate, the waveguide being configured for guiding the optical signal from the modulated ring laser to a defined region;
    a waveguide coupler at the defined region configured for coupling the optical signal into an optical fiber; and
    an optical fiber at the defined region and configured to receive and transport the optical signal to the second computing device;
    wherein the waveguide coupler is a waveguide taper configured for coupling the optical signal parallel to the plane of the substrate.

2. The optical engine of claim 1, wherein the waveguide coupler is a grating pad coupler configured for coupling the optical signal out-of-plane to the plane of the substrate.

3. The optical engine of claim 2, wherein the optical fiber is a light core of a photonic crystal fiber orientated out-of-plane to the plane of the substrate.

4. The optical engine of claim 1, wherein the optical fiber is a member of an optical fiber ribbon orientated parallel to the plane of the substrate.

5. An optical engine for transmitting point-to-point communications between a first computing device and a second computing device comprising:
    a plurality of modulated ring lasers on a first substrate and coupled to a first computing device, each modulated ring laser being configured for generating an optical signal traveling parallel to the plane of the first substrate, said plurality of ring lasers being arranged around a periphery of a first central location of said substrate;
    a corresponding plurality of output waveguides formed in a plane parallel to the plane of the first substrate, each output waveguide being configured for guiding the optical signal from a corresponding modulated ring laser to said first central location;
    a corresponding plurality of transmitting waveguide couplers congregated at the first central location and configured for bending the optical signal from a corresponding output waveguide out-of-plane to the plane of the first substrate; and
    a multi-core optical fiber at the central location and configured to receive and transport the optical signals from the congregated couplers to the second computing device.

6. The optical engine of claim 5, wherein the transmitting waveguide coupler is configured to bend the optical signal out-of-plane to the first substrate at an angle greater than 30 degrees.

7. The optical engine of claim 5, wherein the transmitting waveguide coupler is a grating coupling pad.

8. The optical engine of claim 5, wherein the multi-core optical fiber is physically coupled to the first substrate at the first central location.

9. The optical engine of claim 5, further comprising an optical detector on a second substrate and coupled to the second computing device, the optical detector being configured for receiving the optical signal from the multi-core optical fiber at a second central location.

10. The optical engine of claim 9, wherein the optical detector is located at the second central location.

11. The optical engine of claim 9, further comprising:
    a receiving waveguide coupler at the second central location for coupling the optical signal from the multi-core optical fiber into a plane parallel to the plane of the second substrate; and
    an input waveguide formed in the plane of the second substrate for guiding the optical signal from the receiving waveguide coupler to the optical detector.

12. The optical engine of claim 11, wherein the receiving waveguide coupler is a grating coupling pad.

13. A method of providing point-to-point communication between a first computing device to a second computing device comprising:
    modulating a ring laser formed on a substrate coupled to the first computing device to produce an optical signal traveling parallel to the plane of the substrate;
    guiding the optical signal in an optical waveguide, formed in a plane parallel to the plane of the substrate, from the ring laser to a waveguide coupler;
    bending the optical signal in the waveguide coupler from traveling parallel to the plane of the substrate to traveling out-of-plane to the plane of the substrate; and
    coupling the optical signal into a multi-core optical fiber, wherein the multi-core optical fiber is configured to transmit the optical signal to the second computing device;
    using a communication protocol with said ring laser that is independent of a communication protocol used by said first computing device from which data is received for communication to said second computing device by modulation of said ring laser.

14. A method of providing point-to-point communication between a first computing device to a second computing device comprising:
- modulating each of a plurality of ring lasers formed around a periphery of a central location on a substrate coupled to the first computing device to produce an optical signal traveling parallel to the plane of the substrate;
- guiding each of the optical signals in an optical waveguide to said central location on the substrate; and,
- with a corresponding plurality of grating coupling pads congregated in said central location, coupling the optical signals from the central location to a direction out of the plane of the substrate and into respective cores of a multi-core optical fiber to transmit the optical signals to the second computing device.

15. The optical engine of claim 5, further comprising a corresponding plurality of optical detectors on a second substrate and coupled to the second computing device, the optical detectors being configured for respectively receiving the optical signals from the multi-core optical fiber at a second central location.

16. The optical engine of claim 15, wherein the optical detectors are located at the second central location.

17. The optical engine of claim 15, further comprising a corresponding second plurality of waveguide couplers configured to couple the optical signals from the multi-core optical fiber at the second central location into respective waveguides running in a plane of said second substrate to said plurality of optical detectors.

18. The optical engine of claim 5, wherein said ring lasers, said output waveguides and said transmitting waveguide couplers are all formed on a single chip using a communication protocol that is independent of said first computing device to which said single chip is connected.

* * * * *